US012355908B2

(12) United States Patent
Jung et al.

(10) Patent No.: US 12,355,908 B2
(45) Date of Patent: Jul. 8, 2025

(54) DISPLAY DEVICE

(71) Applicant: SAMSUNG DISPLAY CO., LTD., Yongin-si (KR)

(72) Inventors: Taehyeog Jung, Hwaseong-si (KR); Tae-Chang Kim, Anyang-si (KR); Hyun Chul Jeong, Suwon-si (KR); Soyoun Jung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 53 days.

(21) Appl. No.: 17/794,050

(22) PCT Filed: Jun. 16, 2020

(86) PCT No.: PCT/KR2020/007748
§ 371 (c)(1),
(2) Date: Jul. 20, 2022

(87) PCT Pub. No.: WO2021/215580
PCT Pub. Date: Oct. 28, 2021

(65) Prior Publication Data
US 2023/0350462 A1 Nov. 2, 2023

(30) Foreign Application Priority Data
Apr. 21, 2020 (KR) .................. 10-2020-0048055

(51) Int. Cl.
G06F 1/16 (2006.01)
H04M 1/02 (2006.01)
H10K 59/80 (2023.01)

(52) U.S. Cl.
CPC ........ H04M 1/0268 (2013.01); G06F 1/1652 (2013.01); G06F 1/1656 (2013.01); H10K 59/873 (2023.02)

(58) Field of Classification Search
None
See application file for complete search history.

(56) References Cited

U.S. PATENT DOCUMENTS 8,890,775 B2  11/2014  Kobayashi
9,195,272 B2  11/2015  O'brien
(Continued)

FOREIGN PATENT DOCUMENTS

CN  108259649 A  7/2018
CN  110580111 A  12/2019
(Continued)

OTHER PUBLICATIONS

International Search Report for PCT/KR2020/007748 dated Jan. 18, 2021.
Written Opinion for PCT/KR2020/007748 dated Jan. 18, 2021.

Primary Examiner — Anthony Q Edwards
Assistant Examiner — Rashen E Morrison
(74) Attorney, Agent, or Firm — CANTOR COLBURN LLP

(57) ABSTRACT

A display device variable between a first mode and a second mode includes a display module including a first portion, a second portion disposed under the first portion, and a third portion disposed between the first portion and the second portion, where the third portion is bent in the first mode, a support part including a support plate disposed under the first portion and a plurality of support bars under the second portion and the third portion, a plate part disposed under the support part and including a magnet part movable in a first direction to be away from or to approach the first portion, and a driving part disposed under the plate part. When being switched from the first mode to the second mode, the third portion is disposed parallel to the first portion, and the magnet part moves in the first direction to overlap the third portion.

21 Claims, 19 Drawing Sheets

(56) References Cited

U.S. PATENT DOCUMENTS

| | | | |
|---|---|---|---|
| 10,203,531 B2 | 2/2019 | Choi et al. | |
| 10,321,583 B2 * | 6/2019 | Seo | G06F 1/1624 |
| 10,362,690 B2 | 7/2019 | Han | |
| 10,575,415 B2 | 2/2020 | Shin | |
| 10,698,446 B2 | 6/2020 | Kim et al. | |
| 10,905,000 B2 | 1/2021 | Lee et al. | |
| 10,910,588 B2 | 2/2021 | Kim et al. | |
| 11,003,219 B1 * | 5/2021 | Kim | G06F 1/1652 |
| 11,016,532 B2 | 5/2021 | Yang | |
| 11,140,790 B2 | 10/2021 | Kim et al. | |
| 11,269,380 B2 | 3/2022 | Cho | |
| 11,315,443 B2 * | 4/2022 | Han | G06F 1/1624 |
| 11,343,361 B2 | 5/2022 | He et al. | |
| 2017/0364119 A1 * | 12/2017 | Lee | G06F 1/1652 |
| 2018/0107250 A1 | 4/2018 | Cho | |
| 2019/0004566 A1 | 1/2019 | Lee et al. | |
| 2020/0264660 A1 * | 8/2020 | Song | G06F 1/1624 |
| 2021/0195008 A1 * | 6/2021 | Lee | G06F 1/1652 |

FOREIGN PATENT DOCUMENTS

| | | |
|---|---|---|
| CN | 110599902 A | 12/2019 |
| CN | 110610960 A | 12/2019 |
| CN | 110782783 A | 2/2020 |
| CN | 110853505 A | 2/2020 |
| JP | 2006091900 A | 4/2006 |
| KR | 1020170095636 A | 8/2017 |
| KR | 1020180039799 A | 4/2018 |
| KR | 1020180043441 A | 4/2018 |
| KR | 1020180130641 A | 12/2018 |
| KR | 1020190032688 A | 3/2019 |
| KR | 101993390 B1 | 6/2019 |
| KR | 1020200013821 A | 2/2020 |

* cited by examiner

DISPLAY DEVICE

TECHNICAL FIELD

Embodiments of the invention relate to a display device, and more particularly, to a display device in which deformation of a bending area of a display panel is improved.

BACKGROUND ART

In general, an electronic device for providing an image to a user such as smartphones, digital cameras, laptop computers, navigations, and smart televisions includes a display device for displaying an image. The display device generates an image to provide the image to the user through a display screen.

In recent years, various types of display devices have been developed with the development of technology of display devices. For example, a flexible display device that is foldable or rollable is being developed. The flexible display device that is variously modified in shape may be easily carried and improve users convenience.

The flexible display device may provide display screens having various sizes to a user. For example, the flexible display device may operate in a normal mode and an expansion mode. In the normal mode, a portion of a flexible display module may be exposed, and a remaining portion of the flexible display module may be disposed in a state of being folded inside a case. The folded remaining portion may be unfolded in the expansion mode. However, in a flexible display device, deformation may occur at the folded portion.

DISCLOSURE OF THE INVENTION

Technical Problem

Embodiments of the invention provide a display device in which deformation of a bending area is improved.

Technical Solution

According to an embodiment of the invention, a display device, which is variable between a first mode and a second mode, includes a display module including a first portion, a second portion disposed under the first portion in the first mode, and a third portion disposed between the first portion and the second portion, where the third portion is bent in the first mode, a support part including a support plate disposed on a rear surface of the first portion and a plurality of support bars disposed on rear surfaces of the second portion and the third portion, a plate part disposed under the support part and including a magnet part movable in a first direction to be away from or to approach the first portion, and a driving part disposed under the plate part. In such an embodiment, when the display device is switched from the first mode to the second mode, the third portion is disposed parallel to the first portion, and the magnet part moves in the first direction to overlap the third portion.

According to an embodiment of the invention, a display device includes a display module, a support part disposed on a rear surface of the display module, where the support part includes a support plate and a plurality of support bars, a first plate disposed under the support plate, a driving part disposed under the first plate, a second plate movable to be away from or to approach the first plate in a first direction, and a magnet part disposed on the second plate. In such an embodiment, when the second plate moves to be away from the first plate in the first direction, the magnet part is disposed under the support bars.

Advantageous Effects

According to embodiments of the invention, when the display device is switched from the first mode to the second mode, the deformation of the third portion may be improved by the magnet part that moves to overlap the third portion in the second mode.

MODE FOR CARRYING OUT THE INVENTION

Figure 1:
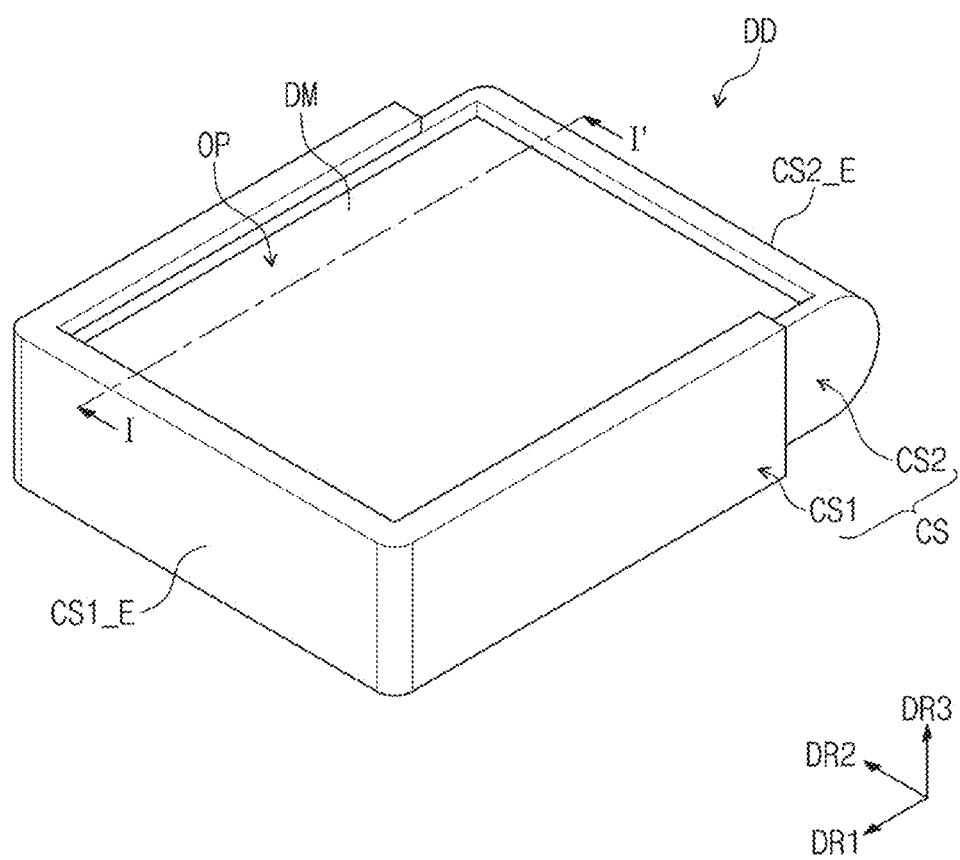
FIGS. 1 and 2 are perspective views of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or area, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

"Or" means "and/or." The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above", "upper", and the like may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by a person of ordinary skill in the art to which the invention belongs. Also, terms such as defined terms in commonly used dictionaries are to be interpreted as having meanings consistent with meaning in the context of the relevant art and are expressly defined herein unless interpreted in an ideal or overly formal sense unless expressly so defined herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
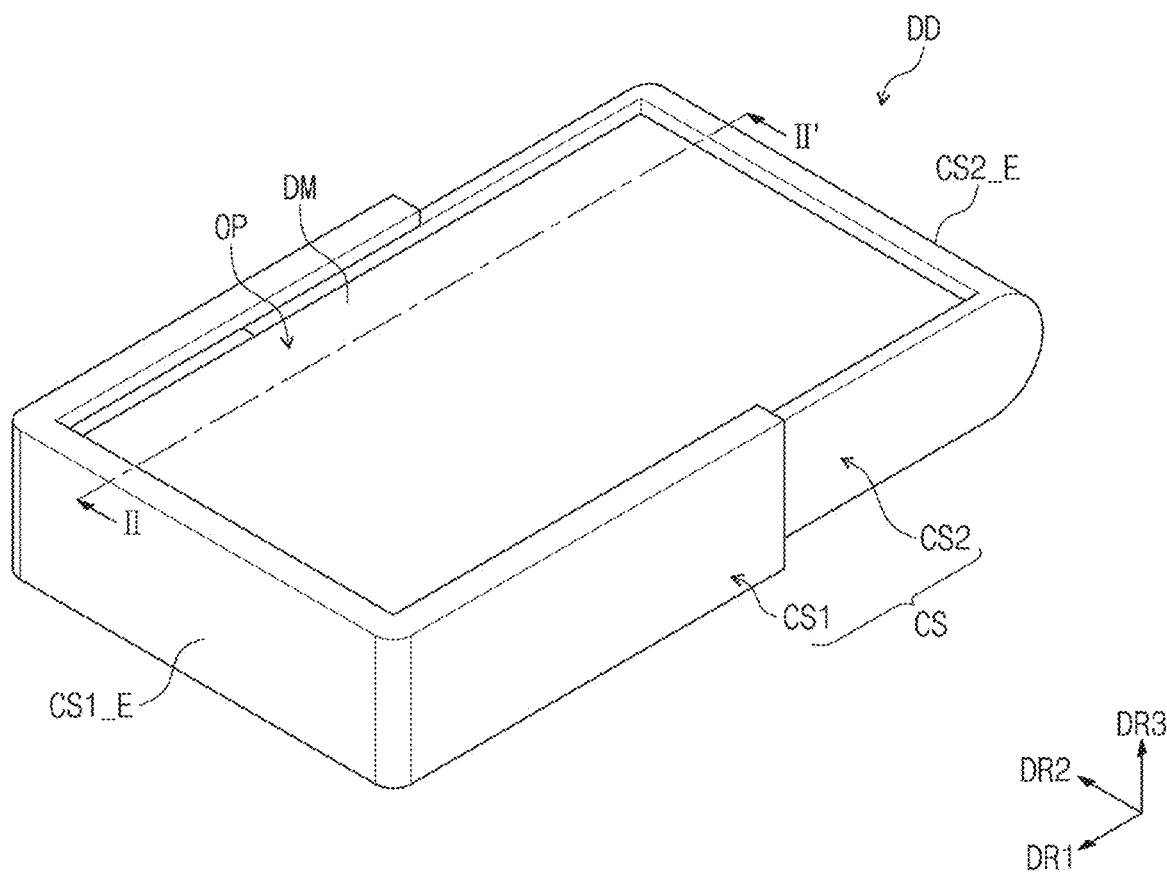

FIGS. 1 and 2 are perspective views of a display device according to an embodiment of the invention.

FIG. 1 shows an embodiment of a display device in a mode (hereinafter, referred to as a first mode) before a display module is expanded, and FIG. 2 shows an embodiment of a display device in a mode (hereinafter, referred to as a second mode) in which the display module is expanded.

Referring to FIGS. 1 and 2, an embodiment of a display device DD may include a display module DM and a case CS. The case CS may accommodate the display module DM. The display module DM may be exposed to an outside the display device DD through an opening OP defined in an upper portion of the case CS.

The case CS may include a first case CS1 and a second case CS2 coupled to each other to accommodate the display module DM. The second case CS2 may be coupled to the first case CS1 to move in a first direction DR1. That is, the second case CS2 may move away from or approach the first case CS1.

Hereinafter, a direction crossing the first direction DR1 is defined as a second direction DR2. A direction substantially perpendicularly crossing a plane defined by the first and second directions DR1 and DR2 is defined as a third direction DR3. In this specification, the term "viewed in a plan view" may mean a state viewed from the third direction D3.

As the second case CS2 moves in the first direction DR1, an area of the exposed surface of the display module DM may vary.

In an embodiment, for example, the display device DD may operate in the first mode and the second mode according to a position of the second case CS2.

The first mode may be defined as a mode of the display device DD when a distance between an end CS2_E of the second case CS2 and an end CS1_E of the first case CS1 is the smallest. In the first mode, the area of the exposed surface of the display module DM may be minimal.

The second mode may be defined as a mode of the display device DD when the distance between the end CS2_E of the second case CS2 and the end CS1_E of the first case CS1 is the greatest. In the second mode, the area of the exposed surface of the display module DM may be maximized.

The display device DD according to an embodiment of the invention may implement display screens having various sizes. As a result, a user may use a wider display screen while conveniently carrying the display device DD.

According to an embodiment of the invention, the display device DD may include other components disposed between the display module DM and the case CS. These configurations will be described in detail later.

Figure 3:
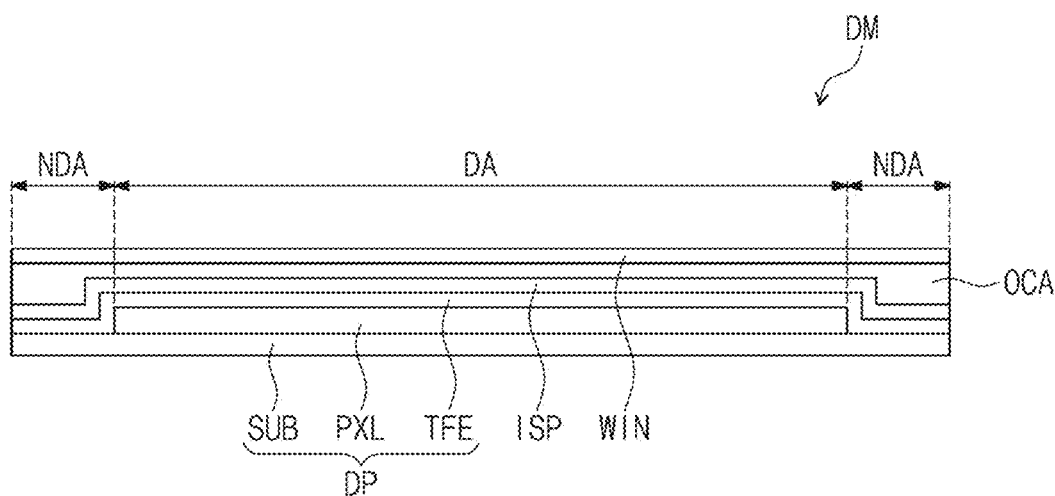
FIG. 3 is a schematic view illustrating a cross-section of the display device according an embodiment of the invention.

FIG. 3 is a schematic cross-sectional view of the display module illustrated in FIG. 1.

Referring to FIG. 3, an embodiment of the display module DM may include a display panel DP, an input sensing part ISP disposed on the display panel DP, a window WIN disposed on the input sensing part ISP, and an adhesive OCA disposed between the input sensing part ISP and the window WIN.

The display panel DP may be an emission type display panel. In an embodiment, for example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, and the like. However, the type of the display panel DP is not limited thereto.

For convenience of description, hereinafter, embodiments where the display panel DP is the organic light emitting display panel will be described in detail.

The display panel DP may be a flexible panel. In an embodiment, for example, the display panel DP may be folded or unfolded in one direction.

The display panel DP may include a substrate SUB, a pixel layer PXL disposed on the substrate SUB, and a thin film encapsulation layer TFL disposed on the substrate SUB to cover the pixel layer PXL.

The substrate SUB may include a display area DA and a non-display area NDA. The display area DA may substantially correspond to the exposed surface of the display module DM, which is exposed through the case CS. The non-display area NDA may correspond to an edge of the display module DM, which is not exposed by being covered by a bezel of the case CS.

The pixel layer PXL may be disposed on the display area DA. The pixel layer PXL may include a plurality of pixels, and each of the pixels may include a light emitting element.

The thin film encapsulation layer TFE may include at least two inorganic layers and an organic layer disposed between the at least two inorganic layers. The inorganic layers may include an inorganic material and protect the pixel layer PXL against moisture/oxygen. The organic layer may include an organic material and protect the pixel layer PXL against foreign substances such as dust particles.

An input sensing part ISP may sense an external input (e.g., a user's touch) to change the external input into a predetermined input signal, thereby providing the input signal to the display panel DP. The input sensing part ISP may include a plurality of sensing electrodes that sense the external input. In an embodiment, for example, the sensing electrodes may sense an external input in a capacitive manner. The display panel DP may receive an input signal from the input sensing part ISP and generate an image corresponding to the input signal.

The window WIN may protect the display panel DP and the input sensing part ISP against external scratch and impact. The window WIN may be attached to the input sensing part ISP by using the adhesive OCA. The adhesive OCA may include an optical clear adhesive. An image generated in the display panel DP may pass through the window WIN and then be provided to the user.

Figure 4:
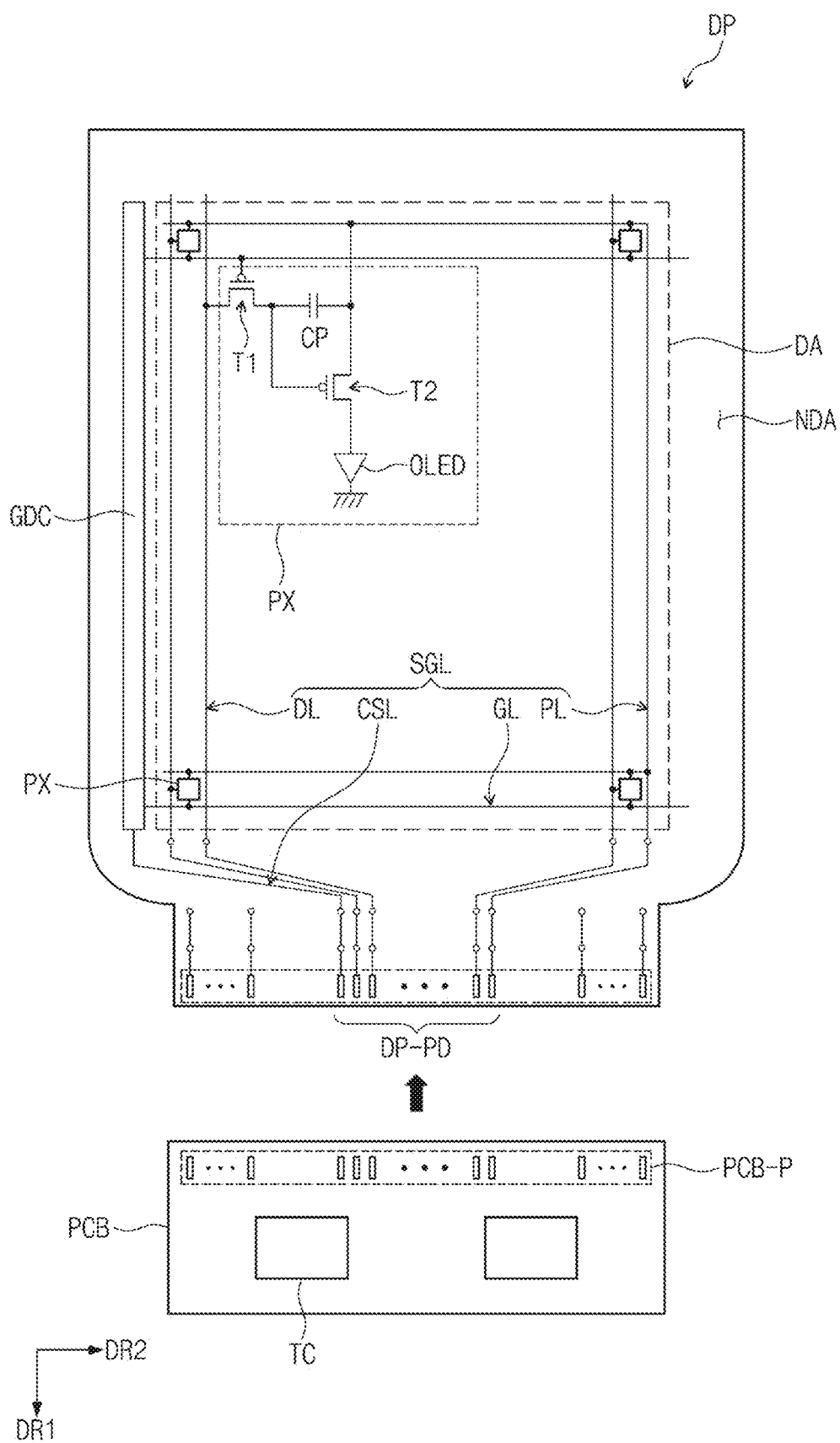
FIG. 4 is a plan view of a display panel illustrated in FIG. 3.

FIG. 4 is a plan view illustrating the display panel illustrated in FIG. 3.

Referring to FIG. 4, an embodiment of the display panel DP may include a driving circuit GDC, a plurality of signal lines SGL, a plurality of signal pads DP-PD, and a plurality of pixels PX.

The driving circuit GDC may include a scan driving circuit. The scan driving circuit GDC generates a plurality of scan signals, and the plurality of scan signals are successively outputted to a plurality of scan lines GL.

The signal lines SGL includes scan lines GL, data lines DL, a power line PL, and a control signal line CSL. The scan lines GL, the data lines DL, and the power line are connected to pixels PX. The control signal line CSL may provide control signals to the scan driving circuit.

The signal pads DP-PD are connected to the data lines DL, the power line PL, and the control signal line CSL, respectively.

The display area DA may be defined as an area on which the pixels PX are disposed. In an embodiment, for example, the pixel PX may include a first transistor T1, a second transistor T2, a capacitor CP, and an organic light emitting diode OLED.

In FIG. 4, a circuit board PCB electrically connected to the display panel DP is additionally illustrated. The circuit board PCB may be a rigid circuit board or a flexible circuit board. A timing control circuit TC for controlling an operation of the display panel DP may be disposed on the circuit board PCB. The circuit board PCB may include circuit board pads PCB-P electrically connected to the signal pads DP-PD of the display panel.

Figure 5:
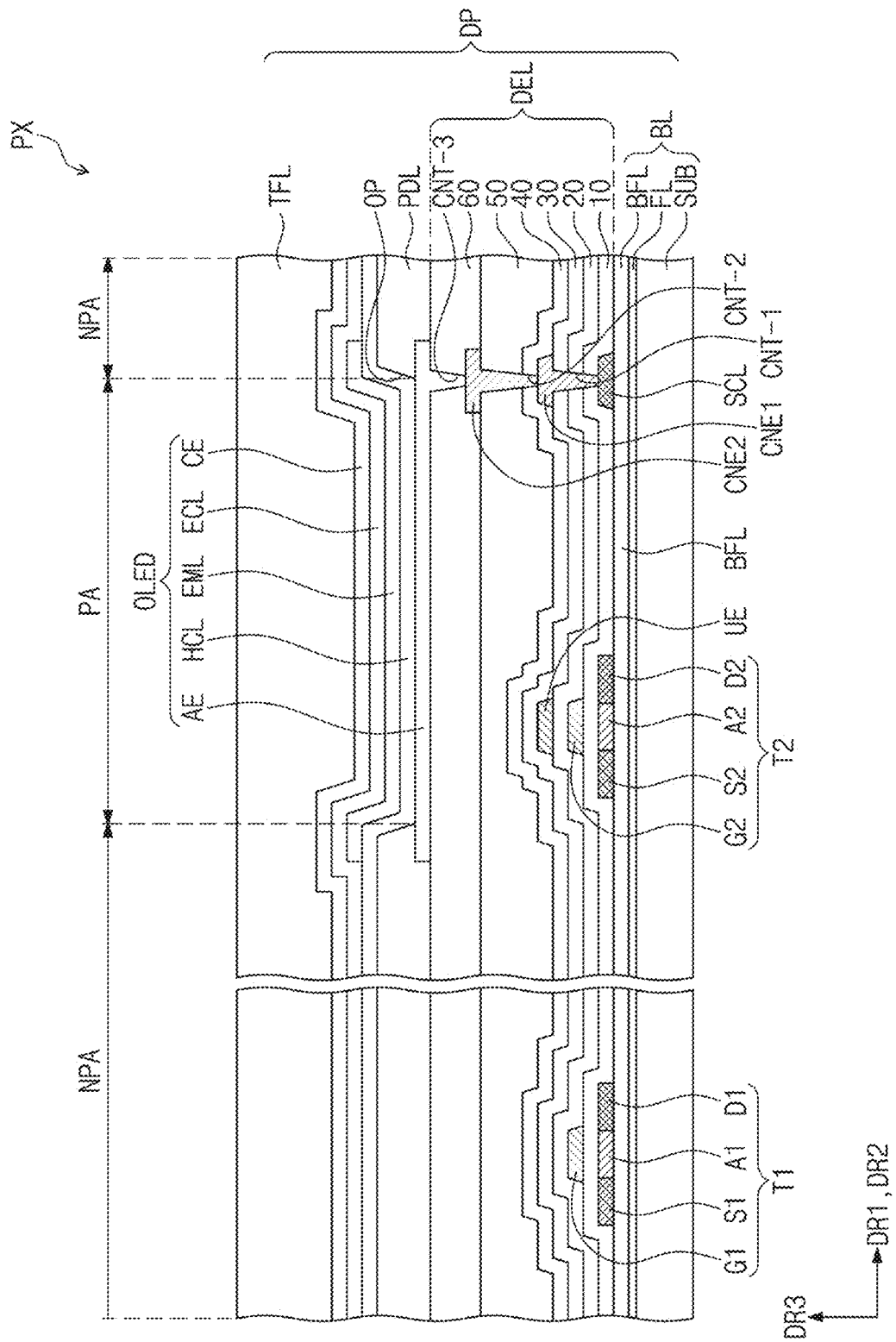
FIG. 5 is a cross-sectional view of a pixel illustrated in FIG. 4.

FIG. 5 is a cross-sectional view of a pixel illustrated in FIG. 4.

Referring to FIG. 5, the display panel DP may include a base layer BL, an element layer DEL, a pixel defining layer PDL, a plurality of light emitting elements OLED, and a thin film encapsulation layer TFL.

The base layer BL may include a substrate SUB, a planarization layer FL and a buffer layer BFL. The substrate SUB may include a plurality of pixel areas PA and a non-pixel area NPA around each of the pixel areas PA. The substrate SUB may be a transparent substrate and include a flexible plastic substrate. In an embodiment, for example, the substrate SUB may include polyimide (PI).

The element layer DEL may include one or more transistors and a plurality of insulating layers. In an embodiment, for example, the element layer DEL may include a first transistor T1 and a second transistor T2. However, a structure of the transistor included in the element layer DEL is not limited thereto.

Sources S1 and S2, actives A1 and A2, and drains D1 and D2 of the first transistor T1 and the second transistor T2 may include or be formed of a semiconductor pattern. The insulating layer 10 may be disposed on the sources S1 and S2, the actives A1 and A2, and the drains D1 and D2, and gates G1 and G2 may be disposed on the insulating layer 10. An insulating layer 20 covering the gates G1 and G2 may be disposed on the gates G1 and G2.

An upper electrode UE may be disposed on the insulating layer 20. The upper electrode UE may overlap the gate G2 of the second transistor T2. An insulating layer 30 covering the upper electrode UE is disposed on the upper electrode UE.

A first connection electrode CNE1 may be disposed on the insulating layer 30 and may be connected to a connection signal line SCL through a contact hole CNT-1. A second connection electrode CNE2 may be disposed on the insulating layers 40 and 50 and may be connected to the first connection electrode CNE1 through a contact hole CNT-2.

An insulating layer 60 covering the second connection electrode CNE2 may be disposed on the second connection electrode CNE2, and the light emitting element OLED may be disposed on the insulating layer 60. The light emitting element OLED is connected to the second connection electrode CNE2 through a contact hole CNT-3.

The pixel defining layer PDL may be disposed on the element layer DEL. Specifically, the pixel defining layer PDL may be disposed on the insulating layer 60. The pixel defining layer PDL may overlap the non-pixel area NPA. A plurality of pixel openings OP overlapping the pixel areas PA may be defined in the pixel defining layer PDL.

The light emitting elements OLED may be disposed in the pixel openings OP defined in the pixel defining layer PDL. Each of the pixel opening OP of the pixel defining layer PDL exposes at least a portion of the first electrode AE. The light emitting elements OLED may include a first electrode AE, a hole control layer HCL, an emission layer EML, an electron control layer ECL, and a second electrode CE, which are sequentially laminated. The second electrode CE may have an integrated shape and may be commonly disposed on the plurality of pixels PX.

The thin film encapsulation layer TFL may be disposed on the second electrode CE. The thin film encapsulation layer TFL may include an organic material or an inorganic material.

Figure 6:
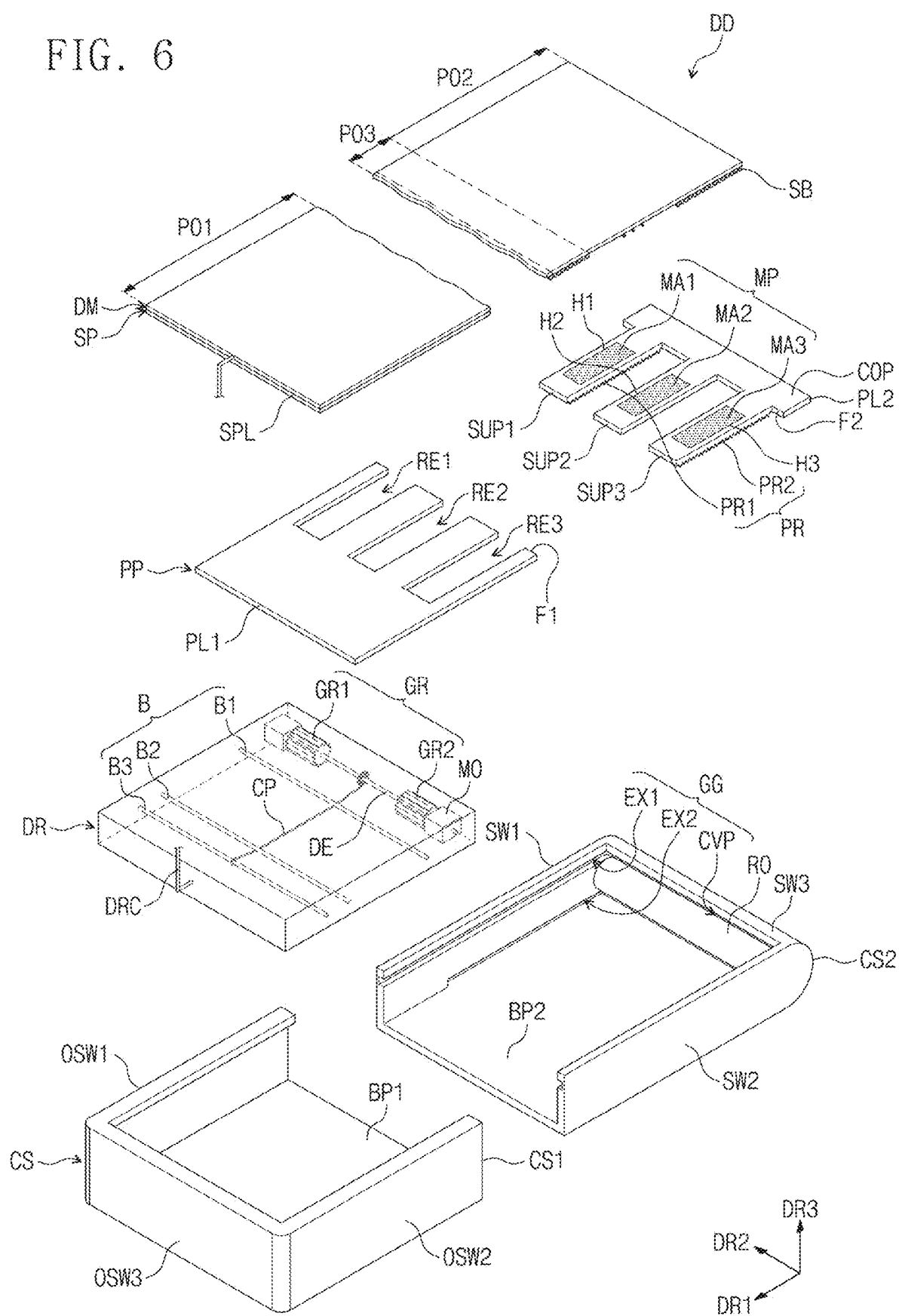
FIG. 6 is an exploded perspective view of the display device illustrated in FIG. 1.
Figure 7:
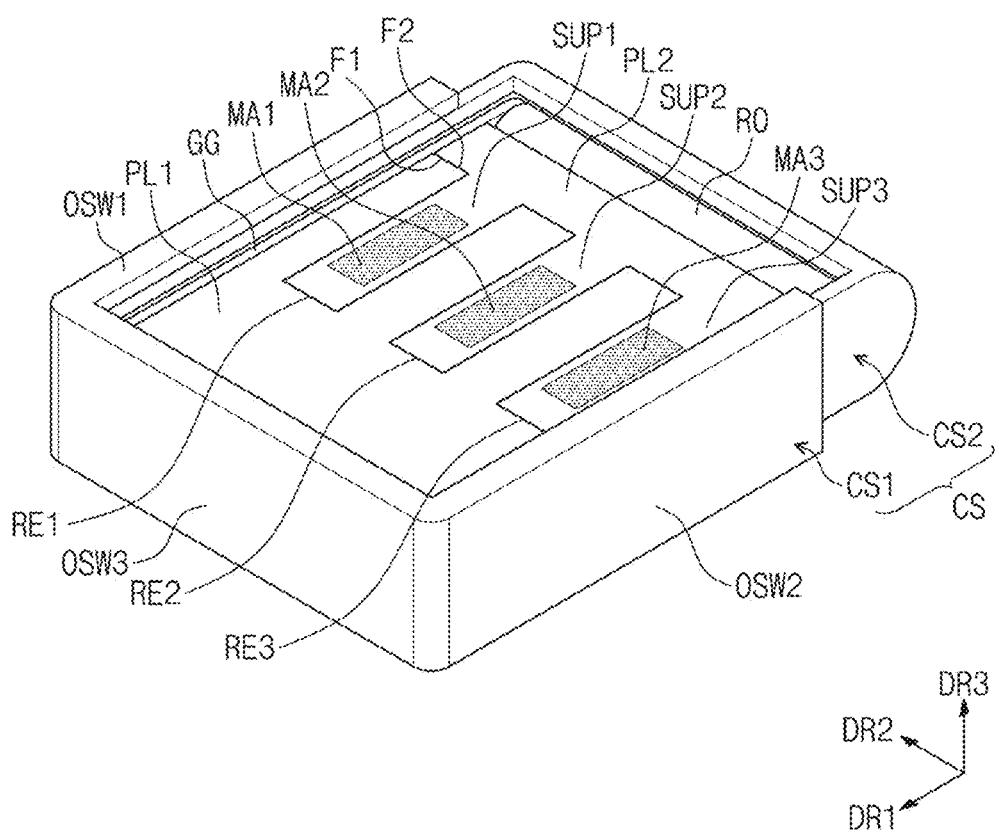
FIG. 7 is a coupling perspective view of the display device illustrated in FIG. 1.

FIG. 6 is an exploded perspective view of the display device illustrated in FIG. 1 according to an embodiment. FIG. 7 is a coupling perspective view of the display device illustrated FIG. 1 according to an embodiment. For convenience of description, the illustration of the display module DM and the support part SP is omitted in FIG. 7.

Referring to FIGS. 6 and 7, an embodiment of the display device DD may include a case CS, a driving part DR, a plate part PP, a magnet part MP, a support part SP, and a display module DM. The driving part DR, the plate part PP, the magnet part MP, the support part SP, and the display module DM may be accommodated in the case CS.

The second case CS2 may be coupled to the first case CS1. In an embodiment, for example, the second case CS2 may be slidably coupled to the first case CS1 in the first direction DR1.

The first case CS1 may have a rectangular parallelepiped shape in which openings are defined or formed in a top surface and one side, respectively. The first case CS1 may define an empty space therein.

In an embodiment, as shown in FIG. 6, the first case CS1 may include a first bottom plate BP1, a first outer wall OSW1, a second outer wall OSW2, and a third outer wall OSW3.

The first bottom plate BP1 may have a rectangular shape when viewed in a plan view. The first to third outer walls OSW1 to OSW3 may extend from an edge of the first bottom plate BR1 in the third direction DR3.

The first outer wall OSW1 and the second outer wall OSW2 may extend in the first direction DR1. The first outer wall OSW1 and the second outer wall OSW2 may face each other. The third outer wall OSW3 may be disposed between one side of the first outer wall OSW1 and one side of the second outer wall OSW2. For convenience of description, in FIGS. 6 and 7, one side may mean a lower left end, and the other side may mean an upper right end. The one side and the other side may be opposite sides in the first direction DR1.

The third outer wall OSW3 may extend in the second direction DR2. An upper portion of the first outer wall OSW1 may be bent toward the first bottom plate BP1. The second outer wall OSW2 may have a shape that is symmetrical to the first outer wall OSW1 with respect to an axis in the first direction DR1.

The second case CS2 may have a rectangular shape when viewed in a plan view. An upper portion of the second case CS2 may be opened. The second case CS2 may define an empty space therein. The second case CS2 may include a second bottom plate BP2, a first sidewall SW1, a second sidewall SW2, and a third sidewall SW3.

The second bottom plate BP2 may have a rectangular shape when viewed in a plan view. The first sidewall SW1 to the third sidewall SW3 may extend from an edge of the second bottom plate BP2 in the third direction DR3.

The first sidewall SW1 and the second sidewall SW2 may extend in the first direction DR1. The first sidewall SW1 and the second sidewall SW2 may face each other. The first sidewall SW1 and the second sidewall SW2 may have shapes that are symmetrical to each other with respect to an axis in the first direction DR1.

Each of other sides of the first sidewall SW1 and the second sidewall SW2 may have a convex shape. In an embodiment, for example, each of the other sides of the first sidewall SW1 and the second sidewall SW2 may have a semicircular shape.

The third sidewall SW3 may be disposed between the other side of the first sidewall SW1 and the other side of the second sidewall SW2. The third sidewall SW3 may extend in the second direction DR2. The third sidewall SW3 may have a convex shape. In an embodiment, for example, an outer circumferential surface of the third sidewall SW3 may be convex toward the other side. Alternatively, an inner circumferential surface of the third sidewall SW3 may be concave toward the other side.

Guide grooves GG may be defined on inner surfaces of the first sidewall SW1 and the second sidewall SW2, respectively. Each of the guide grooves GG may have a "U" shape. The guide groove GG may include a first extension part EX1, a second extension part EX2, and a curved part CVP extending from the first extension part EX1 to the second extension part EX2.

The first extension part EX1 may extend from one side of inner surfaces of each of the first sidewall SW1 and the second sidewall SW2 toward the other side. The curved part CVP may be folded at the other side of each of the inner surfaces of the first sidewall SW1 and the second sidewall SW2. The curved part CVP means a curved section extending from an end of the first extension part EX1 and may have a "C" shape when viewed in the second direction DR2. The second extension part EX2 may extend from an end of the curved part CVP to extend toward one side again.

A roller RO may be disposed in the second case CS2. The roller RO may be rotatably disposed inside the second case CS2. In an embodiment, for example, the roller RO may be disposed adjacent to the inner circumferential surface of the third sidewall SW3. The roller RO may be rotatably mounted on the other side of each of inner surfaces of the first sidewall SW1 and the second sidewall SW2.

The driving part DR may be disposed inside the first case CS1. The driving part DR may be fixed to the first case CS1. In an embodiment, for example, the driving part DR may be fixed to at least one of the first to third outer walls OSW1, OSW2, and OSW3 through an adhesive, screw coupling, or the like.

The driving part DR may include a gear part GR, a rotational force transmission part DE, a motor MO, and at least one guide bar B.

The gear part GR may be disposed at the other side inside the first case CS. In an embodiment, the gear part GR may include a first gear GR1 and a second gear GR2. The first gear GR1 may be disposed adjacent to the first outer wall OSW1, and the second gear GR2 may be disposed adjacent to the second outer wall OSW2.

The first gear GR1 and the second gear GR2 may be connected to the rotational force transmission part DE. The rotational force transmission part DE may rotate by the motor MO. The rotational force transmission part DE may rotate integrally with the first gear GR1 and the second gear GR2. In an embodiment, for example, when the rotational force transmission part DE rotates in one direction by the motor MO, the first gear GR1 and the second gear GR2 may also rotate in the one direction.

The guide bar B may be disposed at one side of the gear part GR. In an embodiment, the driving part DR may include three guide bars B. In such an embodiment, the first guide bar B1, the second guide bar B2, and the third guide bar B3 may be sequentially arranged from the gear part GR. The first guide bar B1 may be disposed closest to the gear part GR, and the third guide bar B3 may be disposed most spaced apart from the gear part GR. The second guide bar B2 may be disposed between the first guide bar B1 and the third guide bar B3. The guide bars B1 to B3 may perform a function of guiding movement of the connection part CP, which will be described later. Although not shown, a main board may be disposed at one side of the driving part DR. The main board may control an operation of each of the display module DM and the motor MO.

The plate part PP may be disposed on the driving part DR. The plate part PP may include a first plate PL1, a second plate PL2, and a magnet part MP.

The first plate PL1 may have a rectangular shape when viewed in a plan view. The first plate PL1 may be fixedly mounted inside the first case CS1. In an embodiment, for example, the first plate PL1 may be mounted inside the first case CS1 using an adhesive, screw coupling, or the like.

A recess parallel to the first direction may be defined in the first plate PL1. In an embodiment, for example, the recess may extend from a first surface F1 of the first plate PL1 toward a center of the first plate PL1.

In an embodiment, the first plate PL1 may include a first recess RE1, a second recess RE2, and third recesses RE3. When viewed in the plan view, each of the first to third recesses RE1 to RE3 may have a rectangular shape. The first recesses RE1 to the third recesses RE3 may be spaced apart from each other in the second direction DR2.

The second plate PL2 may be disposed inside the second case CS2. The second plate PL2 may be fixed to the second case CS2. In an embodiment, for example, the second plate PP2 may be fixed to the first sidewall SW1 and the second sidewall SW2 of the second case CS2 through an adhesive, screw coupling, or the like.

In a state in which the second case CS2 is coupled to the first case CS1, the second plate PL2 may be disposed at the same height as the first plate PL1 in the third direction DR3.

The second plate PL2 may include a sub-plate extending in the first direction DR1. In an embodiment, the second plate PL2 may include a first sub-plate SUP1, a second sub-plate SUP2, a third sub-plate SUP3, and a connection plate COP.

The first to third sub-plates SUP1 to SUP3 may extend from the second surface F2 of the connection plate COP to extend toward the first plate PL1. The connection plate COP may extend in the second direction DR2. The connection plate COP may be fixed to the first sidewall SW1 and the second sidewall SW2 of the second case CS2.

At least a portion of the sub-plate may be inserted into the recess to move in the first direction DR1.

In an embodiment, for example, the first sub-plate SUP1 may be disposed in the first recess RE1. The second sub-plate SUP2 may be disposed in the second recess RE2. The third sub plate SUP3 may be disposed in the third recess RE3. The first surface F1 of the first plate PL1 and the second surface F2 of the second plate PL2 may be contact with each other.

The magnet part MP may be disposed on the second plate PL2. When viewed in the plan view, the magnet part MP may have a rectangular shape. However, the shape of the magnet part MP is not limited thereto.

The magnet part MP may include a permanent magnet. In an embodiment, for example, the magnet part MP may include samarium, scandium, yttrium, neodymium, or the like.

In an embodiment, the magnet part MP may include a first magnet MA1, a second magnet MA2, and a third magnet MA3. The first magnet MA1 may be disposed on the first sub-plate SUP1. The second magnet MA2 may be disposed on the second sub-plate SUP2. The third magnet MA3 may be disposed on the third sub-plate SUP3.

The magnet part MP may be inserted into grooves defined in the second plate PL2. In an embodiment, the first magnet MA1 may be inserted into a first groove H1 defined in the first sub-plate SUP1. The second magnet MA2 may be inserted into a second groove H2 defined in the second sub-plate SUP2. The third magnet MA3 may be inserted into a third groove H3 defined in the third sub-plate SUP3.

In such an embodiment, as described above, the magnet part MP is disposed on the second plate PL2, but the invention is not limited thereto. Alternatively, the second plate PL2 itself may include or be made of a magnetic material, and also, the magnetic material may be a permanent magnet or an electromagnet.

The plate part PP may further include a protrusion PR on a bottom surface of the plate part PP. In an embodiment, for example, the protrusion PR may be disposed on a bottom surface of the second plate PL2. The protrusion PR may include a first protrusion PR1 and a second protrusion PR2. The first protrusion PR1 may be disposed on a bottom surface of the first sub-plate SUP1. The second protrusion PR2 may be disposed on a bottom surface of the third sub-plate SUP3. The first protrusion PR1 and the second protrusion PR2 may be disposed or arranged along the first direction DR1.

The first protrusion PR1 and the second protrusion PR2 may be coupled to rotate while engaged with the first gear GR1 and the second gear GR2. However, the arrangement structure of the protrusion PR is not limited thereto. The arrangement structure of the protrusion PR may be variously modified. In an embodiment, for example, the protrusion PR may also be disposed on the bottom surface of the third sub-plate SUP3.

The display module DM may include a first portion PO1, a second portion PO2, and a third portion PO3. The third portion PO3 may be disposed between the first portion PO1 and the second portion PO2.

The shape of the display module DM may vary. Specifically, in the first mode (see FIG. 1), the first portion PO1 of the display module DM may be exposed to the outside, and the second portion PO2 and the third portion PO3 may be disposed inside the second case CS2. The third portion PO3 may be disposed in a state of being bent between the third sidewall SW3 and the roller RO.

In the second mode (see FIG. 2), the first portion PO1, the third portion PO3, and a portion of the second portion PO2 of the display module DM may be exposed to the outside. The third portion PO3 and the portion of the second portion PO2 may be deployed parallel to the first portion PO1 in the first direction DR1. A remaining portion of the second portion PO2 may be disposed inside the second case CS.

The shape of the display module DM may vary as the second plate PL2 on which the magnet part MP is disposed moves in the first direction DR1. Details related to this structure will be described later.

The support part SP may be disposed on a rear surface of the display module DM. An adhesive may be disposed between the display module DM and the support part SP. In an embodiment, for example, the adhesive may be a pressure sensitive adhesive. The support part SP may be attached to the display module DM by the adhesive.

The support part SP may include a support plate SPL and a plurality of support bars SB arranged at one side of the support plate SPL. The support plate SPL may be disposed on a rear surface of the first portion PO1. The plurality of support bars SB may be disposed on rear surfaces of the second portion PO2 and the third portion PO3.

Each of the support bars SB may extend in the second direction DR2 and the support bars SB may be arranged in the first direction DR1. The support bars SB may be spaced apart from each other in the other first direction DR1. When viewed in the second direction DR2, each of the support bars SB may have an inverted trapezoid shape.

In an embodiment, as described above, the support bars SB may be spaced apart from each other, but the structure of the support bars SB is not limited thereto. In an alternative embodiment, for example, the support bars SB may be implemented in a joint structure in which the support bars SB are rotatably coupled to each other.

The support plate ST may include a metal material. In the second mode, the support bars SB overlapping the third portion PO3 among the support bars SB may be magnetically coupled to the magnet part MP. This will be described later. However, the material of the support bar SB is not limited thereto, and in an alternative embodiment, the support bar SB may include a non-metal material. In such an embodiment, a coating layer including a metal material may be further disposed on a bottom surface of the support bar SB.

The connection part CP may connect the driving part DR to an end of the second portion PO2 or any one of the outermost support bars SB of the plurality of support bars SB. In an embodiment, for example, the connection part CP may be a wire. One end of the connection part CP may be fixed to the rotational force transmission part DE. The connection part CP may be wound or unwound while being wound around the rotational force transmission part DE. The connection part CP may be guided to move by the first to third guide bars B1, B2, and B3. The other end of the connection part CP may be connected to an end of the second portion PO2. In an alternative embodiment, for example, the other end of the connection part CP may be connected to the support bar SB disposed to overlap the end of the second portion PO2.

The driving part DR and the display module DM may be connected to each other by a driving connector DRC. One end of the driving connector DRC may be connected to the main board of the driving part DR, and the other end of the driving connector DRC may be connected to the timing control circuit TC (see FIG. 4) of the display panel DP. The main board may apply a signal to the display module DM through the driving connector DRC.

Figure 8:
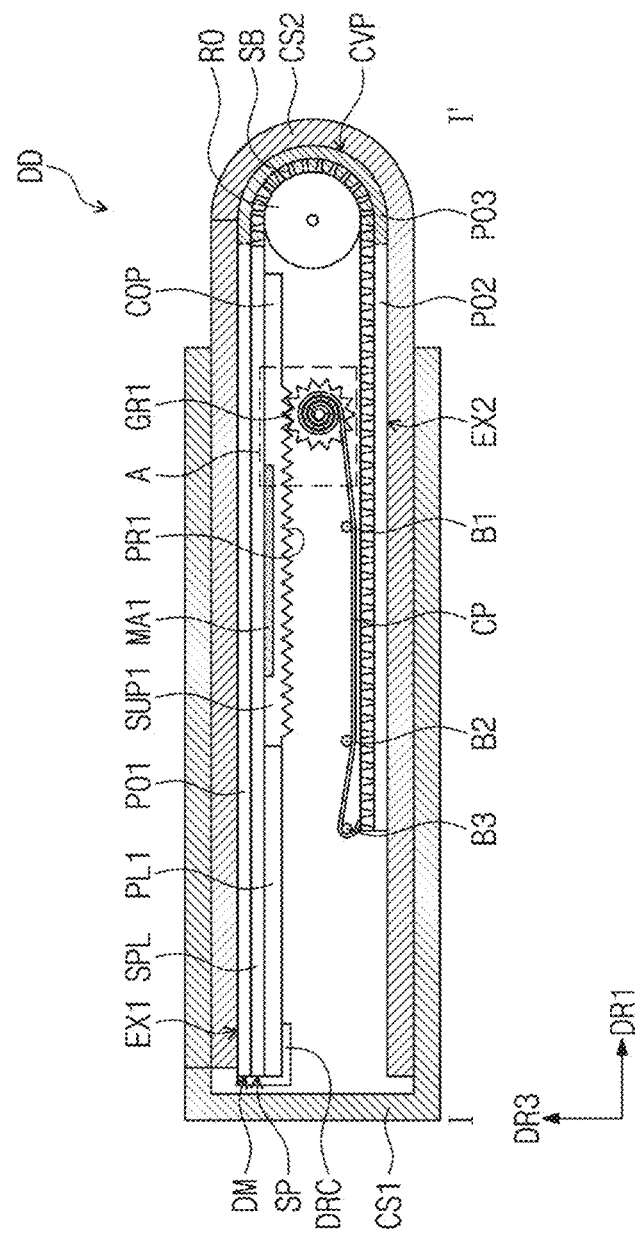
FIG. 8 is a cross-sectional view taken along line I-I' of FIG. 1.

FIG. 8 is a cross-sectional view taken along line I-I' of FIG. 1.

Figure 9:
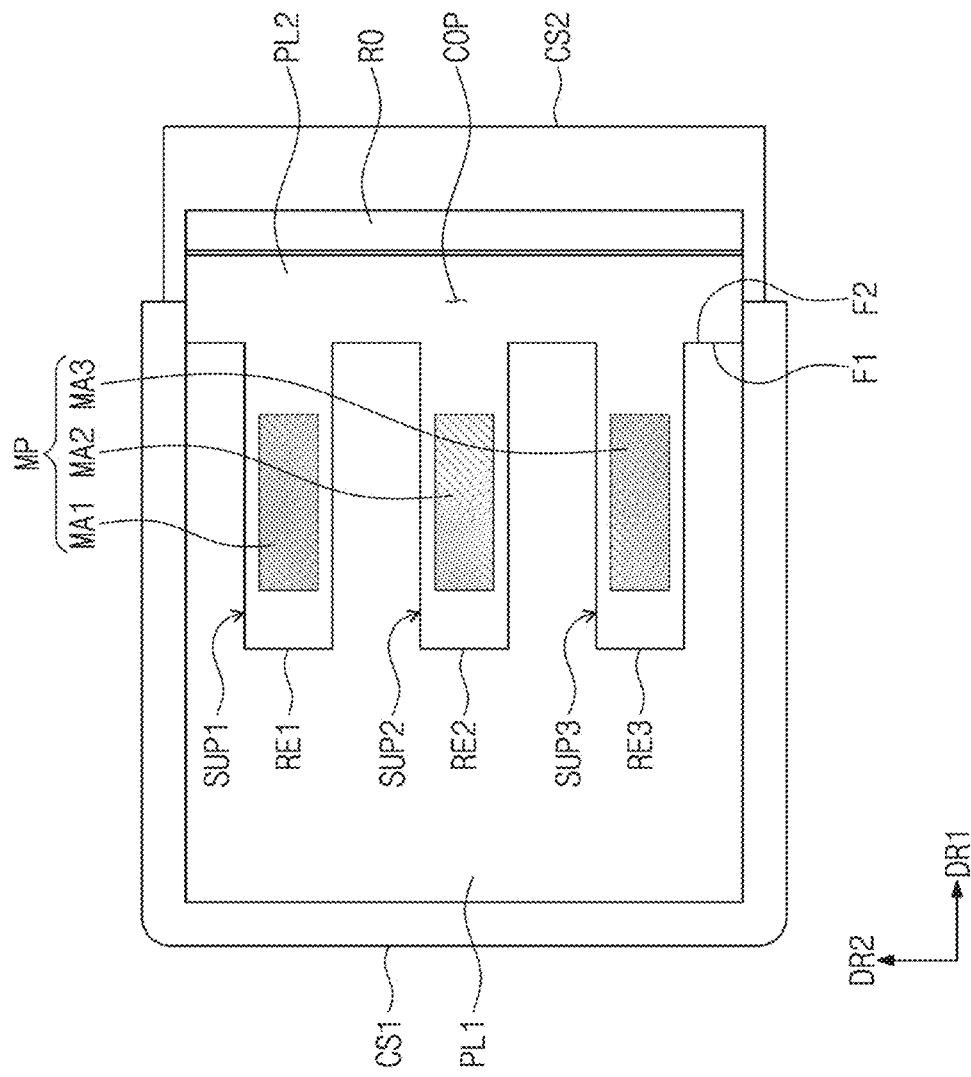
FIG. 9 is a plan view of the display device illustrated in FIG. 1.

FIG. 9 is a plan view of the display device illustrated in FIG. 1.

Particularly, FIGS. 8 and 9 are views illustrating the display device DD in the first mode. For convenience of description, the illustration of the display module DM and the support part SP is omitted in FIG. 9.

Referring to FIGS. 8 and 9, in the first mode, an area of the exposed surface of the display module DM may be minimal. Specifically, in the first mode, the third portion PO3 may be bent in a downward direction (e.g., the third direction DR3) with respect to the roller RO. The second portion PO2 may be disposed under the first portion PO1. The second portion PO2 may be disposed parallel to the second bottom plate BP2.

The first to third sub-plates SUP1 to SUP3 of the second plate PL2 may be completely inserted into the first to third recesses RE1 to RE3 of the first plate PL1, respectively. The first surface F1 of the first plate PL1 may be in contact with the second surface F2 of the connection plate COP of the second plate PL2. In this case, a position of the second plate PL2 may be defined as a first point.

In the first mode, the magnet part MP may overlap the first portion PO1 of the display module DM. Specifically, the first magnet MA1 may be disposed below the first portion PO1. Although not illustrated, positions of the second magnets MA2 and the third magnets MA3 in the first direction DR1 may be the same as that of the first magnet MA1.

In the first mode, the first portion PO1 and the support plate SPL may be disposed on the first extension part EX1. The second portion PO2, the third portion PO3, and the plurality of support bars SB may be disposed on the curved part CVP and the second extension part EX2.

The gear part GR may allow the second plate PL2 to move in the first direction DR1. Specifically, the first gear GR1 may rotate while being coupled to the first protrusion PR1. As a result, the second plate PL2 on which the first protrusion PR1 is formed may linearly move in the first direction DR1. Although not shown, the second gear GR2 may also rotate while being coupled to the second protrusion PR2 (see FIG. 6).

Figure 10:
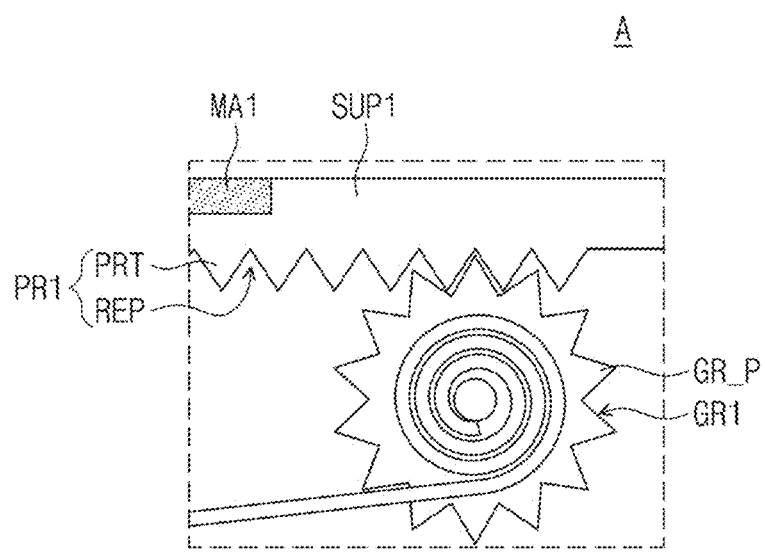
FIG. 10 is an enlarged view of a portion A illustrated in FIG. 8.

FIG. 10 is an enlarged view of portion A illustrated in FIG. 8.

Referring to FIG. 10, the first protrusion PR1 may include a plurality of protrusions PRT. Each of the protrusions PRT may have a triangular pillar shape extending in the second direction DR2. A recessed portion REP may be defined between adjacent protrusions PRT. When viewed in the second direction DR2, the protrusions PRT may have an inverted triangular shape, and the recessed portion REP may have a triangular shape.

The first gear GR1 may include a plurality of gear protrusions GR_P. Each of the gear protrusions GR_P may have a triangular pillar shape extending in the second direction DR2. When viewed in the second direction DR2, each of the gear protrusions GR_P may have a triangular shape.

The shape of the gear protrusions GR_P may correspond to the shape of the recessed portion REP. At least one pair of gear protrusions GR_P of the first gear GR1 may be disposed in the recessed portion REP of the first protrusion PR1. The second protrusion PR2 and the second gear GR2 may have the same shape as the first protrusion PR1 and the first gear GR1, respectively (see FIG. 6).

Figure 11:
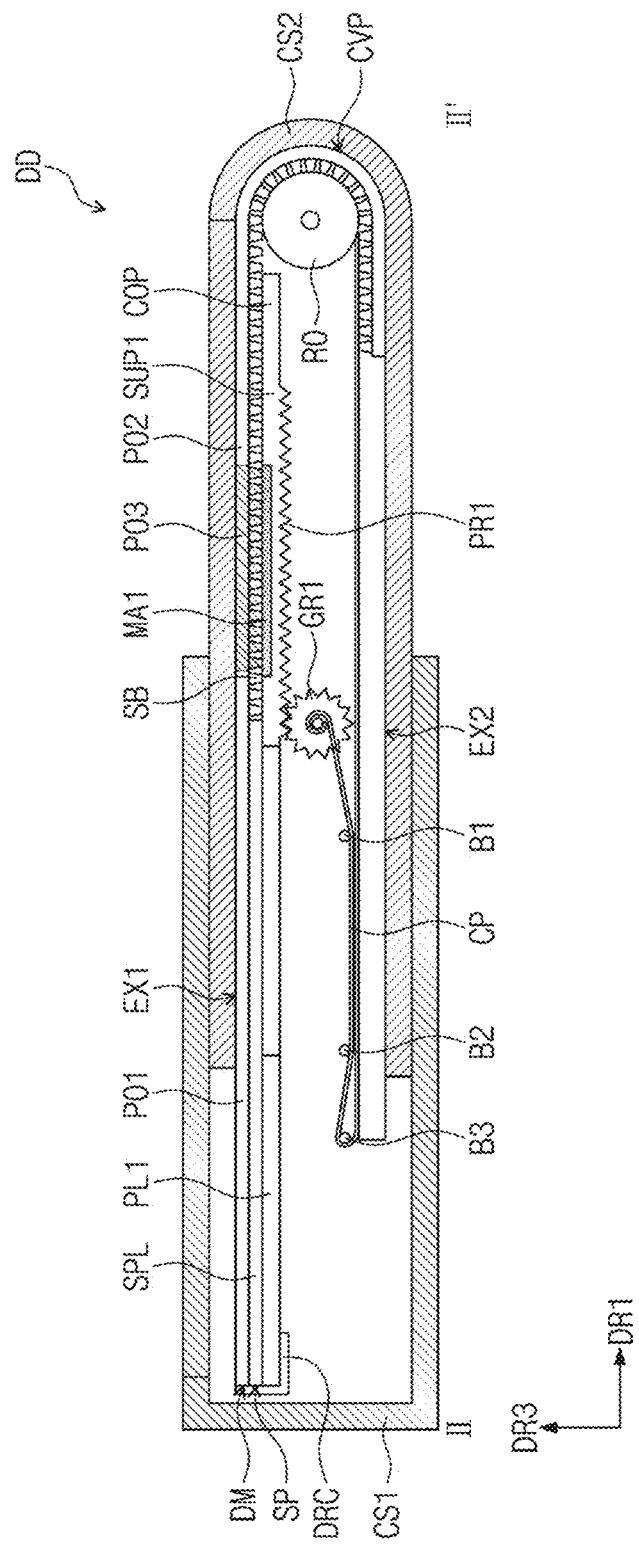
FIG. 11 is a cross-sectional view taken along line II-II' of FIG. 2.

FIG. 11 is a cross-sectional view taken along line II-II' of FIG. 2.

Figure 12:
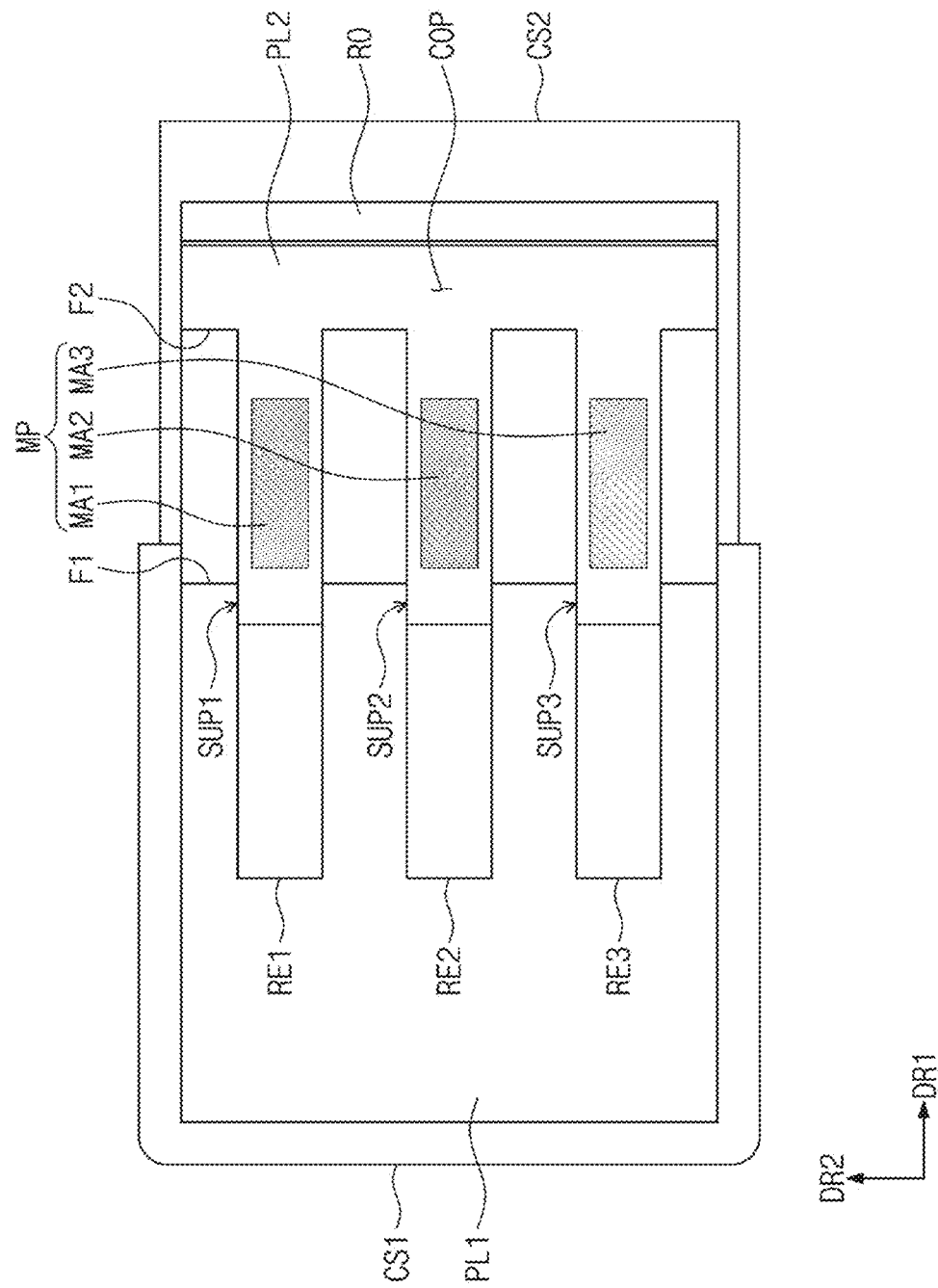
FIG. 12 is a plan view of the display device illustrated in FIG. 2.

FIG. 12 is a plan view of the display device illustrated in FIG. 2.

Substantially, FIGS. 11 and 12 are views illustrating the display device DD in the second mode.

For convenience of description, the illustration of the display module DM and the support part SP is omitted in FIG. 12.

Referring to FIGS. 11 and 12, the display device DD may be switched from the first mode to the second mode.

Specifically, when the motor MO of the driving part DR operates, the rotational force transmission part DE may rotate in a clockwise direction. As the rotational force transmission part DE rotates, the gear part GR may rotate in the clockwise direction.

The first gear GR1 may rotate while being coupled to the first protrusion PR1. Similarly, the second gear GR2 may rotate while being coupled to the second protrusion PR2. As a result, the second plate PL2 may move to a right side in the first direction DR1. Since the second plate PL2 is fixed to the second case CS2, the second case CS2 may also move integrally with the second plate PL2.

As the first gear GR1 and the second gear GR2 rotate in the clockwise direction, the connection part CP wound around the rotational force transmission part DE may be loosened. The loosened connection parts CP may move by the guide bars B1, B2, and B3. The connection part CP may hold an end of the second portion PO2 while the second portion PO2 is unfolded so that the display module DM is stably unfolded.

In the second mode, the area of the exposed surface of the display module DM may be maximized. Specifically, as the second plate PL2 moves to a right side along the first direction DR1, the third portion PO3 and a portion of the second portion PO2 of the display module DM may be unfolded in the first direction DR1. In the second mode, the third portion PO3 and a portion of the second portion PO2 may be disposed parallel to the first portion PO1.

The first plate PL1 may overlap the first portion PO1. The second plate PL2 may overlap a portion of the first portion PO1, the third portion PO3, and a portion of the second portion PO2. The second plate PL2 may support a portion of the first portion PO1. As the second plate PL2 supports at least a portion of the first portion PO1 even in the second mode, flatness between the first portion PO1 and the third portion PO3 of the display module DM may be stably maintained.

In the second mode, the magnet part MP may overlap the third portion PO3 of the display module DM. In an embodiment, the magnet part MP may be disposed under the support bars SB overlapping the third portion PO3 among the plurality of support bars SB.

The magnet part MP may be magnetically coupled to the third portion PO3. In an embodiment, the magnet part MP may be magnetically coupled to the support bars SB overlapping the third portion PO3. As a result, the third portion PO3 of the display module DM and the support bars SB overlapping the third portion PO3 may be in close contact with the magnet part MP.

According to an embodiment, as the magnet part MP overlaps the third portion PO3 in the second mode, deformation of the third portion PO3 may be improved. In detail, since the third portion PO3 is disposed in a bent shape in the first mode, even when the display device DD is switched to the second mode so that the third portion PO3 is unbent, residual deformation may remain in the third portion PO3. However, in an embodiment of the invention, the magnet part MP overlapping the third portion PO3 may be provided in the second mode to minimize deformation of the third portion PO3.

Hereinafter, alternative embodiments of a display device having structures different from that of the above-described embodiment will be described. In the following description, any repetitive detailed descriptions of a configuration substantially the same as that of the above-described embodiment will be omitted, and a configuration different from that of the above-described embodiment will be described in detail.

Figure 13:
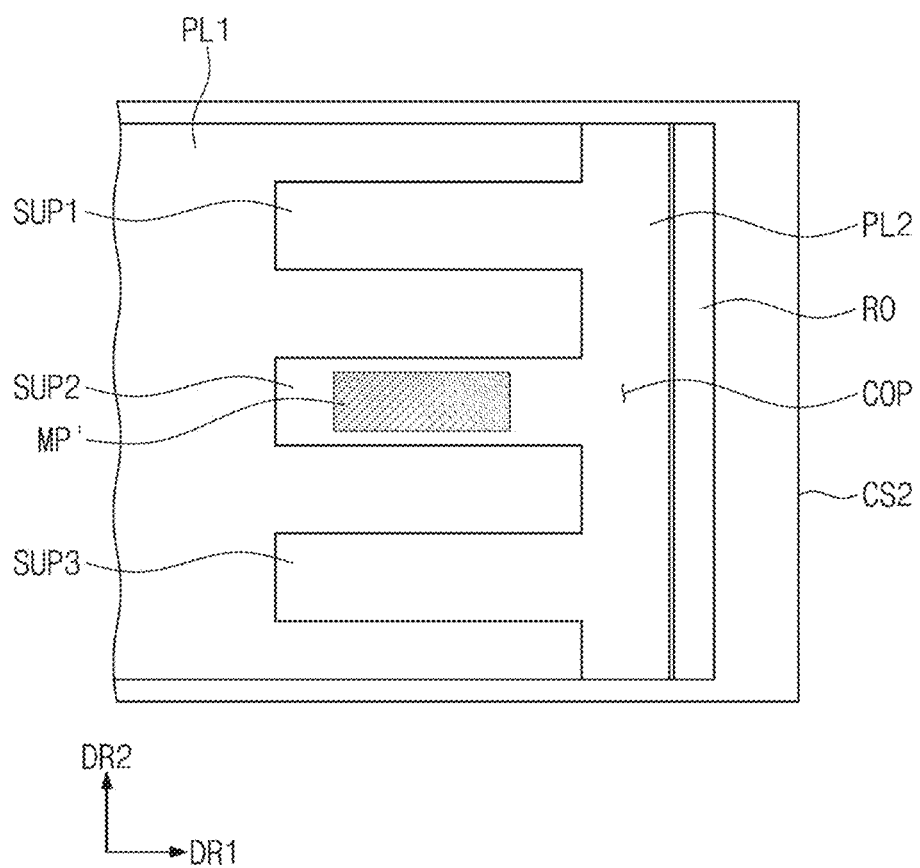
FIGS. 13 to 14 are views illustrating a structure, in which a magnet part of the display device is disposed, according to an embodiment of the invention.
Figure 14:
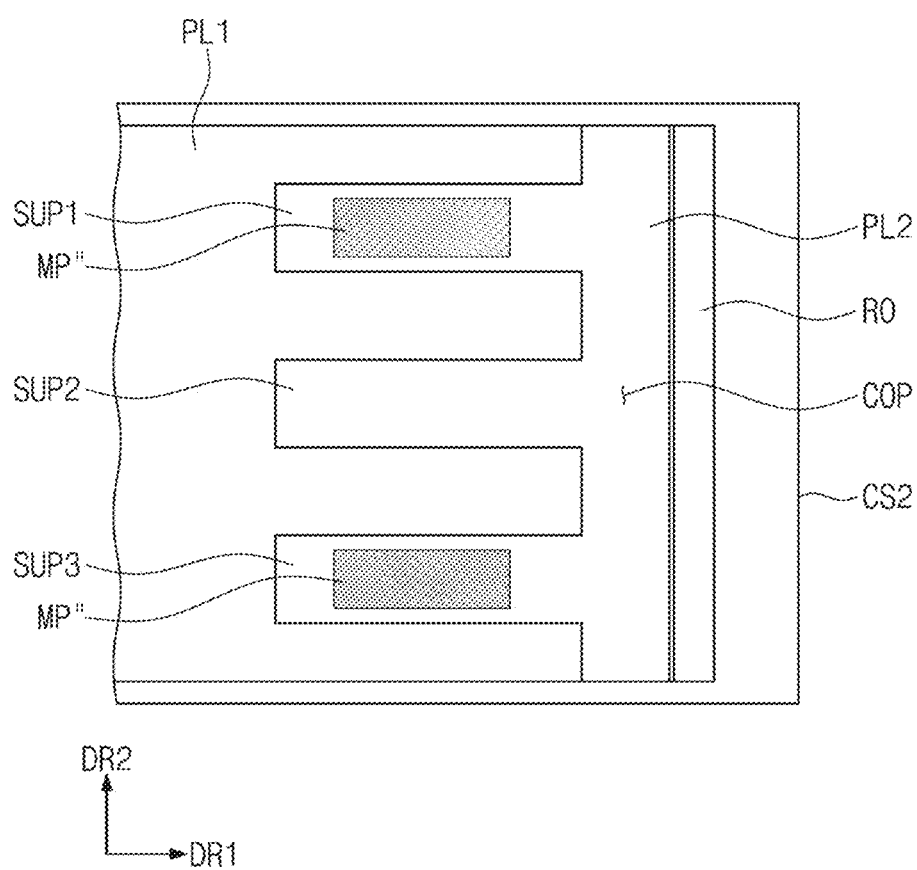

FIGS. 13 to 14 are views illustrating a structure, in which the magnet part of the display device is disposed, according to an embodiment of the invention.

Referring to FIGS. 13 and 14, in alternative embodiments, an arrangement shape of magnet parts MP' and MP" may be variously modified. In an embodiment, for example, the magnet parts MP' and MP" may be disposed on only some of the three sub-plates SUP1 to SUP3.

In an embodiment, the magnet part MP' may be disposed on the second sub-plate SUP2 disposed between the first sub-plate SUP1 and the third sub-plate SUP3 (see FIG. 13). The magnet part MP" may be disposed on the first sub-plate SUP1 and the third sub-plate SUP3 (see FIG. 14).

As described above, in an embodiment where the magnet parts MP' and MP" are disposed on only some sub-plates rather than on all the sub-plates, a process of manufacturing the display device DD may be facilitated, and a weight of the display device DD may be reduced.

Figure 15:
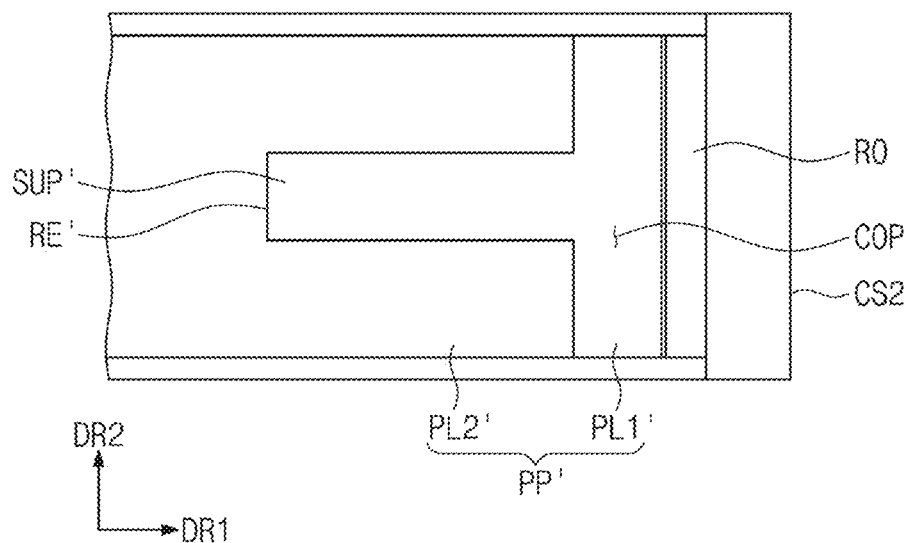
FIGS. 15 and 16 are views illustrating a structure of a plate part of the display device according to an embodiment of the invention.
Figure 16:
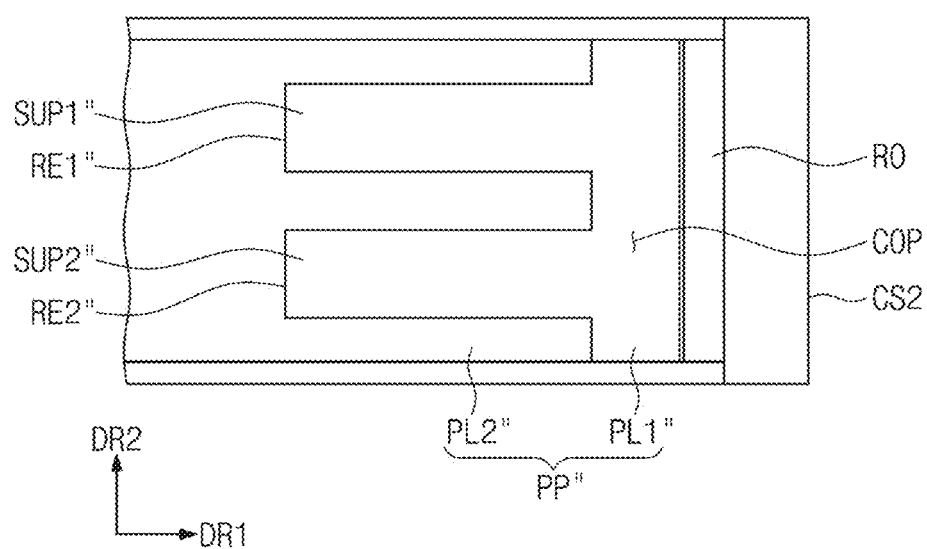

FIGS. 15 and 16 are views illustrating a structure of the plate part of the display device according to an embodiment of the invention.

Referring to FIGS. 15 and 16, in alternative embodiments, shapes of the plate parts PP' and PP" may be variously modified.

In an embodiment, for example, the second plates PL2' and PL2" may include one or two sub-plates. The shapes of the first plates PL1' and PL1" may be changed to correspond to those of the second plates PL2' and PL2", respectively.

In an embodiment, the second plate PL2' may include one sub-plate SUP' disposed at a central portion thereof. The first plate PL1' may include a recess RE' defined in a central portion corresponding to the shape of the second plate PL2' (see FIG. 15).

The second plate PL2" may include two sub-plates SUP1" and SUP2" that are spaced apart from each other in the second direction DR2. The first plate PL1' may include two recesses RE1" and RE2" corresponding to the shape of the second plate PL2" (see FIG. 16).

Although not shown, protrusions may be further provided on bottom surfaces of the sub-plates SUP', SUP1", and SUP2", respectively.

As described above, in an embodiment where the second plates PL2' and PL2" include one or two sub-plates, a process of manufacturing the second plates PL2' and PL2" may be facilitated.

Figure 17:
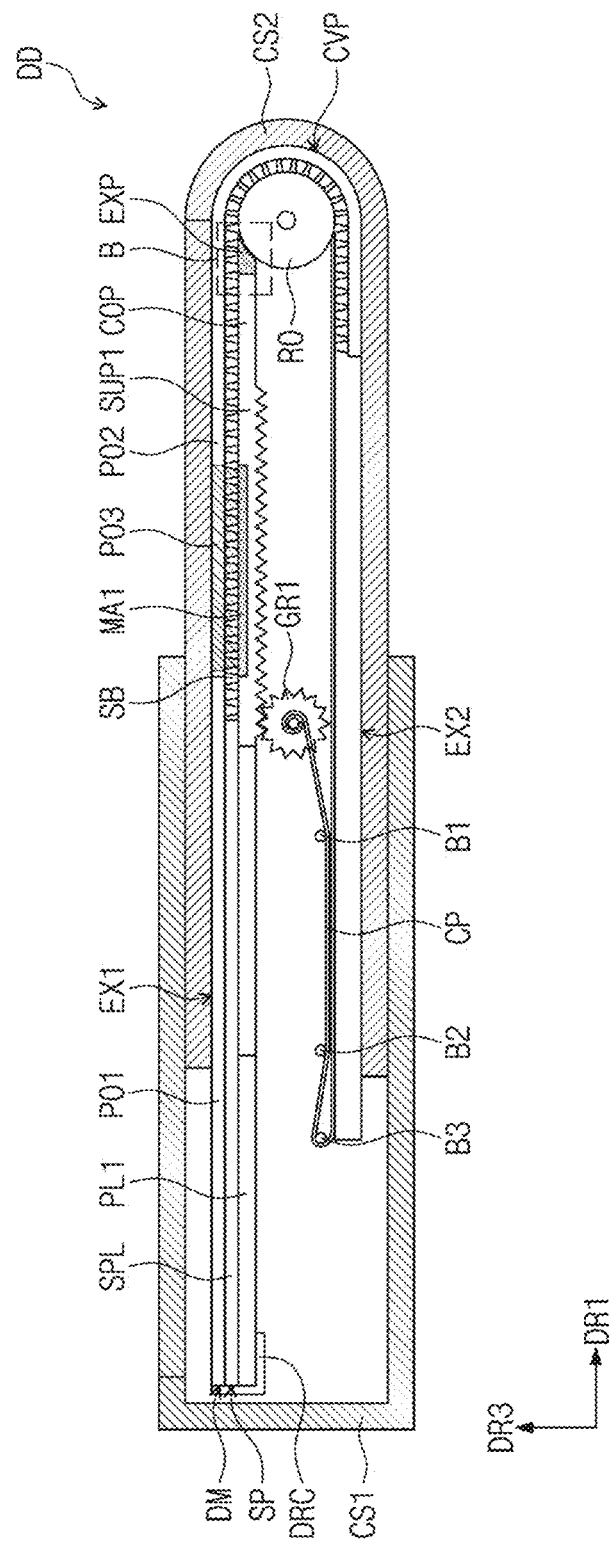
FIG. 17 is a cross-sectional view of the display panel according to an embodiment of the invention.

FIG. 17 is a cross-sectional view of the display panel according to an embodiment of the invention.

Figure 18:
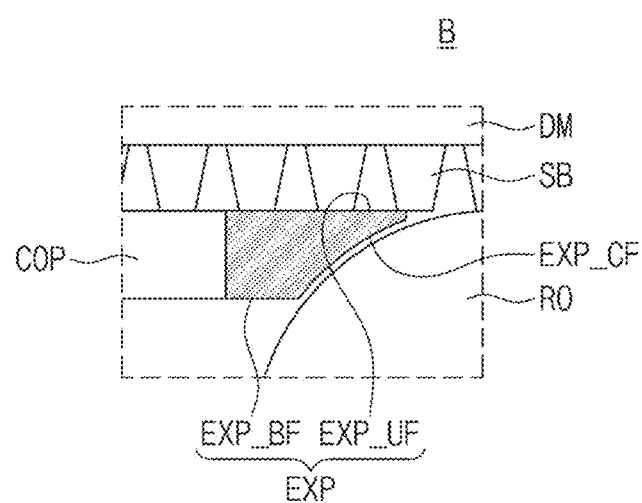
FIG. 18 is an enlarged view of a portion B illustrated in FIG. 17.

FIG. 18 is an enlarged view of a portion B illustrated in FIG. 17.

Referring to FIGS. 17 and 18, in an alternative embodiment, the second plate PL2 may further include an extension plate EXP disposed between the connection plate COP and the roller RO.

The extension plate EXP may extend from the connection plate COP in the first direction DR1. A top surface EXP_UF of the extension plate EXP may overlap the display module DM.

The extension plate EXP may include a curved surface EXP_CF. The curved surface EXP_CF may face an outer circumferential surface of the roller RO. As the surface facing the roller RO in the extension plate EXP is formed as a curved surface EXP_CF, the top surface EXP_UF of the extension plate EXP may further extend in the first direction DR1 than a bottom surface EXP_BF.

The top surface EXP_UF of the extension plate EXP may support the display module DM and the support bar SB disposed in a space between the connection plate COP and the roller RO.

According to an embodiment of the invention, as the second plate PL2 further includes the extension plate EXP that is disposed between the connection plate COP and the roller RO, the plate part PP may more stably support the display module DM and the support bar SB.

Figure 19:
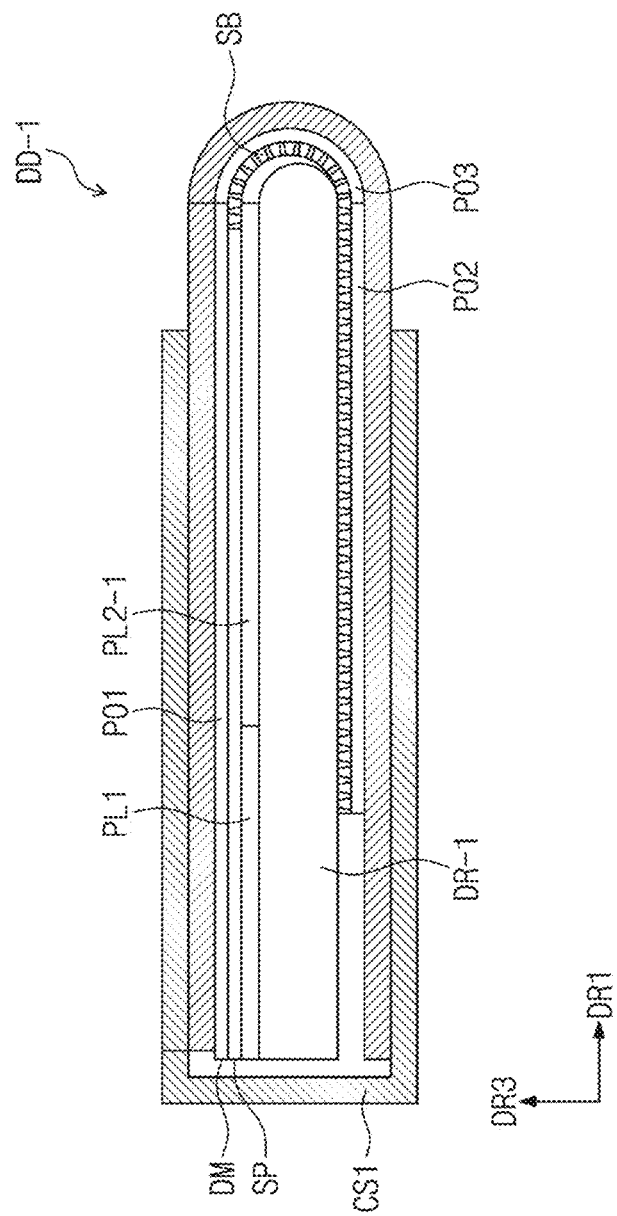
FIGS. 19 and 20 are cross-sectional views of the display device according to an embodiment of the invention.
Figure 20:
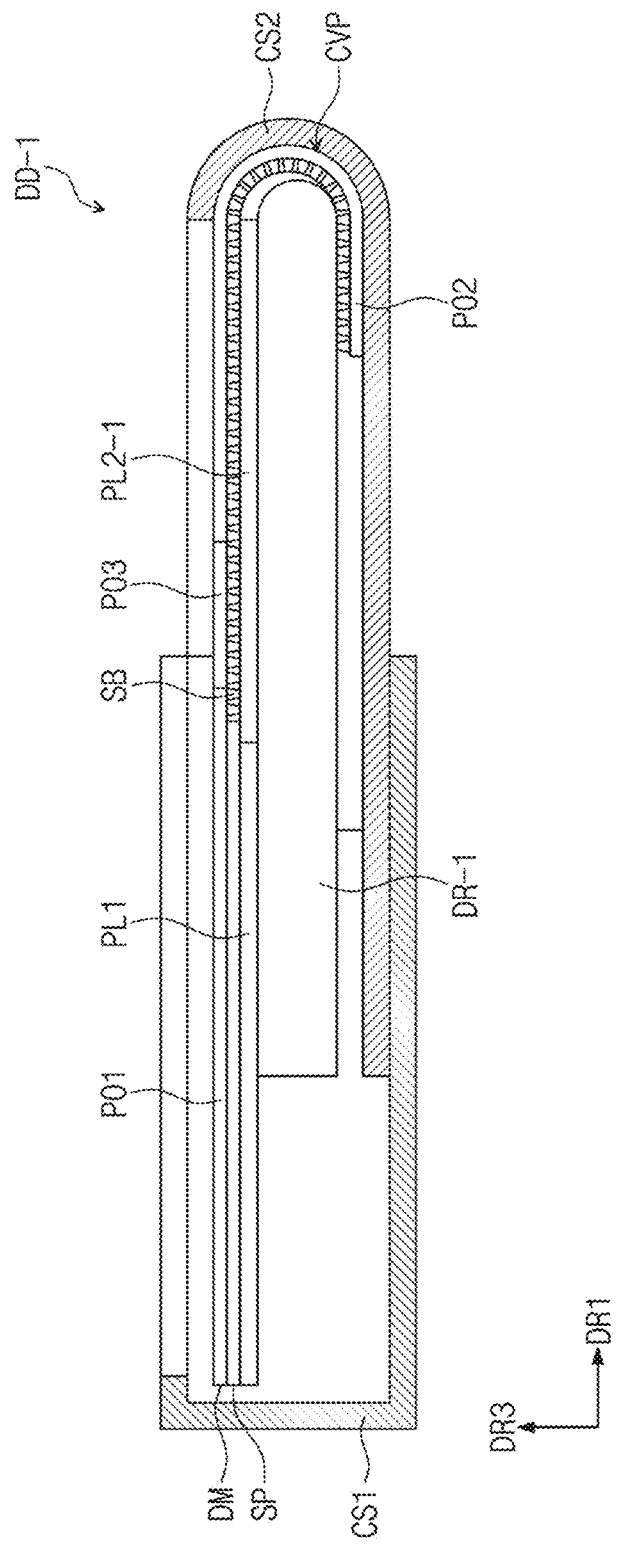

FIGS. 19 and 20 are cross-sectional views of the display device according to an embodiment of the invention.

Referring to FIGS. 19 and 20, in an alternative embodiment of the display device DD-1, a second plate PL2-1 may be disposed on a driving part DR-1. The second plate PL2-1 may be fixed to a top surface of the driving part DR-1.

In an embodiment, the driving part DR-1 may be fixed inside the second case CS2. In an embodiment, for example, the driving part DR-1 may be fixed to the second case CS2 through an adhesive, screw coupling, or the like.

The driving part DR-1 may move in the first direction DR1. Specifically, in the first mode, the driving part DR-1 may be disposed under the first portion PO1 (see FIG. 19). In the second mode, the driving part DR-1 may be disposed under a portion of the first portion PO1 and the second portion PO2.

The second plate PL2-1 may move integrally with the driving part DR-1. As a result, in the first mode, the second plate PL2-1 may overlap the first portion PO1. In the second mode, the second plate PL2-1 may overlap the second portion PO2 and the third portion PO3.

The second plate PL2-1 may include an electromagnet. The driver DR-1 may selectively apply current to the second plate PL2-1. In an embodiment, for example, the driving part DR-1 may not apply current to the second plate PL2-1 in the first mode. The driving part DR-1 may apply current to the second plate PL2-1 in the second mode.

In the second mode, as the driving part DR-1 applies the current to the second plate PL2-1, the second plate PL2-1 may be magnetically coupled to the second portion PO2 and the third portion PO3. In such an embodiment, the second plate PL2-1 may be magnetically coupled to the support bars SB overlapping the second and third portions PO2 and PO3.

According to an embodiment of the invention, as the driving part DR-1 supplies the current to the second plate PL2-1 in the second mode, the second plate PL2-1 may be magnetically coupled to an expanded area (i.e., the second portion PO2) of the display module DM and the third portion PO3. Therefore, the deformation of the extended portion of the display module DM may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

INDUSTRIAL APPLICABILITY

According to the embodiments of the invention, the deformation of the flexible display device may be improved. Therefore, the invention has high industrial applicability.

The invention claimed is:

1. A display device, which is variable between a first mode and a second mode, the display device comprising:
a display module comprising a first portion, a second portion disposed under the first portion in the first mode, and a third portion disposed between the first portion and the second portion, wherein the third portion is bent in the first mode;
a support part comprising a support plate disposed on a rear surface of the first portion and a plurality of support bars disposed on rear surfaces of the second portion and the third portion;
a plate part disposed under the support part and comprising a magnet part movable in a first direction to be away from or to approach the first portion; and
a driving part disposed under the plate part,
wherein, when the display device is switched from the first mode to the second mode, the third portion is disposed parallel to the first portion, the magnet part moves in the first direction to overlap the third portion, and the magnet part is closer to the third portion than the second portion disposed under the third portion.

2. The display device of claim 1, wherein the plate part comprises:
a first plate disposed under the first portion; and
a second plate on which the magnet part is disposed.

3. The display device of claim 2, wherein
a recess parallel to the first direction is defined in the first plate, and
the second plate comprises a sub-plate parallel to the first direction,
wherein, when the second plate moves to approach the first plate along the first direction, at least a portion of the sub-plate is inserted into the recess.

4. The display device of claim 3, wherein
the recess is provided in plurality,
the plurality of recesses are spaced apart from each other in a second direction crossing the first direction, and
the sub-plate is provided in plurality, and
the plurality of sub-plates are disposed in the plurality of recesses, respectively.

5. The display device of claim 3, wherein the magnet part is disposed on the sub-plate.

6. The display device of claim 5, wherein the magnet part is disposed in a groove defined in the sub-plate.

7. The display device of claim 5, wherein the second plate is movable from a first point to a second point along the first direction,
wherein, when the second plate is disposed at the first point, the magnet part overlaps the first portion, and
when the second plate moves to the second point, the magnet part overlaps the third portion.

8. The display device of claim 1, wherein the plate part further comprises a protrusion on a bottom surface of the plate part.

9. The display device of claim 8, wherein the driving part comprises a gear part coupled to rotate by being engaged with the protrusion.

10. The display device of claim 9, further comprising a connection part which connects an end of the second portion or any one of the outermost support bars of the plurality of support bars to the driving part.

11. The display device of claim 1, wherein the driving part is fixed to overlap the first portion.

12. The display device of claim 10, further comprising a driving connector configured to connect the driving part to the display module.

13. The display device of claim 1, wherein each of the plurality of support bars comprises a magnetic material.

14. The display device of claim 1, further comprising:
a first case which accommodates the first portion, the support plate, and the driving part; and
a second case which accommodates the first portion, the plurality of support bars, and the magnet part,
wherein the second case is coupled to the first case to move in the first direction to be away from or to approach the first case.

15. The display device of claim 14, wherein opposing sides of each of the plurality of support bars are inserted into guide grooves defined in inner surfaces of the second case, which face each other in a second direction crossing the first direction, to move along the guide grooves, respectively.

16. The display device of claim 15, wherein each of the guide grooves comprises:
a first extension part extending in the first direction;
a second extension part extending in the first direction and disposed under the first extension part; and
a curved part extending from the first extension part to the second extension part.

17. The display device of claim 14, further comprising:
a roller inside the second case and rotatably coupled to the second case; and
an extension plate disposed between the plate part and the roller,
wherein the extension plate has a curved surface.

18. The display device of claim 1, wherein
the plate part is disposed on the driving part, and
the plate part and the driving part move integrally.

19. A display device comprising:
a display module comprising a first portion, a second portion disposed under the first portion in the first mode, and a third portion disposed between the first portion and the second portion, wherein the third portion is bent in a first mode;
a support part disposed on a rear surface of the display module, wherein the support part comprises a support plate and a plurality of support bars;
a first plate disposed under the support plate;
a driving part disposed under the first plate;
a second plate movable to be away from or to approach the first plate in a first direction; and
a magnet part disposed on the second plate, wherein the magnet part includes a magnet,
wherein, when the second plate moves to be away from the first plate in the first direction in a second mode, the third portion is disposed parallel to the first portion, the magnet part is disposed under the support bars, and the magnet part is closer to the third portion than the second portion disposed under the third portion.

20. The display device of claim 19, wherein the second plate further comprises a protrusion on a bottom surface thereof.

21. An electronic device for providing image comprising a display device, which is variable between a first mode and a second mode,
wherein the display device comprises:
a display module comprising a first portion, a second portion disposed under the first portion in the first mode, and a third portion disposed between the first portion and the second portion, wherein the third portion is bent in the first mode;
a support part comprising a support plate disposed on a rear surface of the first portion and a plurality of support bars disposed on rear surfaces of the second portion and the third portion;
a plate part disposed under the support part and comprising a magnet part movable in a first direction to be away from or to approach the first portion; and
a driving part disposed under the plate part,
wherein, when the display device is switched from the first mode to the second mode, the third portion is disposed parallel to the first portion, the magnet part moves in the first direction to overlap the third portion, and the magnet part is closer to the third portion than the second portion disposed under the third portion.

* * * * *